US010621297B1

(12) United States Patent
Baumgartner et al.

(10) Patent No.: US 10,621,297 B1
(45) Date of Patent: Apr. 14, 2020

(54) INITIAL-STATE AND NEXT-STATE VALUE FOLDING

(71) Applicant: International Business Machines Corporation, Armonk, NY (US)

(72) Inventors: Jason R. Baumgartner, Austin, TX (US); Robert L. Kanzelman, Rochester, MN (US); Pradeep Kumar Nalla, Sheffield (GB); Raj Kumar Gajavelly, Andhra Pradesh (IN); Dheeraj Baby, Kerala (IN)

(73) Assignee: International Business Machines Coporation, Armonk, NY (US)

( * ) Notice: Subject to any disclaimer, the term of this patent is extended or adjusted under 35 U.S.C. 154(b) by 6 days.

(21) Appl. No.: 16/145,385

(22) Filed: Sep. 28, 2018

(51) Int. Cl.
*G06F 17/50* (2006.01)

(52) U.S. Cl.
CPC .......... *G06F 17/505* (2013.01); *G06F 17/504* (2013.01); *G06F 17/5022* (2013.01); *G06F 17/5081* (2013.01)

(58) Field of Classification Search
CPC ............... G06F 17/505; G06F 17/5081; G06F 17/5022; G06F 17/504
See application file for complete search history.

(56) References Cited

U.S. PATENT DOCUMENTS

| | | | |
|---|---|---|---|
| 5,537,580 A | 7/1996 | Giomi et al. | |
| 6,493,648 B1 * | 12/2002 | Anderson | G06F 17/505 702/119 |
| 8,326,592 B2 | 12/2012 | McMillan | |
| 8,954,909 B2 | 2/2015 | Andraus et al. | |
| 9,075,935 B2 | 7/2015 | Vasudevan et al. | |
| 9,477,805 B2 | 10/2016 | Bencivenga et al. | |
| 9,489,477 B2 | 11/2016 | Bjesse | |
| 9,875,325 B2 | 1/2018 | James et al. | |

(Continued)

FOREIGN PATENT DOCUMENTS

WO 2017103572 A1 6/2017

OTHER PUBLICATIONS

Meade, T., Zhang, S., & Jin, Y. (2017). IP protection through gate-level netlist security enhancement. Integration, the VLSI Journal, 58, pp. 563-570.

(Continued)

*Primary Examiner* — Jack Chiang
*Assistant Examiner* — Brandon Bowers
(74) *Attorney, Agent, or Firm* — Patterson + Sheridan, LLP

(57) ABSTRACT

A computing system determines a first set of registers having constant next-state functions in the netlist. The computing system identifies an observable gate in fan-out of a register in the first set, wherein an observable gate is a gate that is critical to a verification or synthesis context. The computing system identifies a second set of reducible registers in the fan-in of the observable gate. The computing system modifies at least one of an initial value and a next-state function of at least one reducible register of the second set to reflect an observable value of the at least one reducible register observed at the observable gate. The computing system simplifies one or more logic gates implementing the observable gate and the fan-in of the observable gate by eliminating a reference to a constant next-state function register in the first set of registers.

20 Claims, 10 Drawing Sheets

(56) References Cited

U.S. PATENT DOCUMENTS

2017/0124240 A1* 5/2017 Baumgartner ........ G06F 17/505

OTHER PUBLICATIONS

Brayton, R., & Mishchenko, A. ABC: An Academic Industrial-Strength Verification Tool. 2010.
Mishchenko, et al., "Scaleable Don't-Care-Based Logic Optimization and Resynthesis", FPGA '09, Feb. 22-29, 2009, Monterey, CA, 9 pp.

* cited by examiner

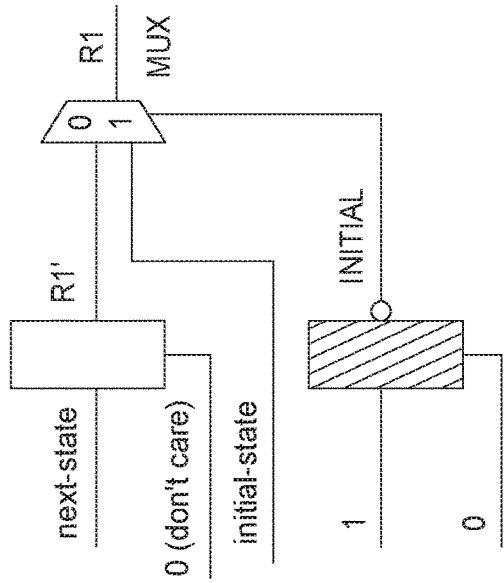
FIG. 1A
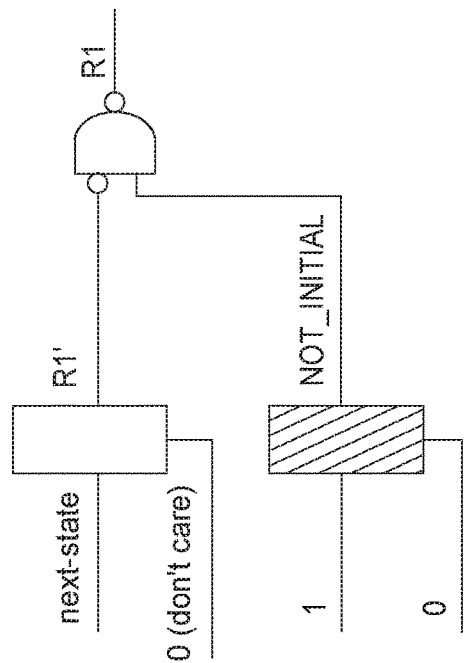
FIG. 1B
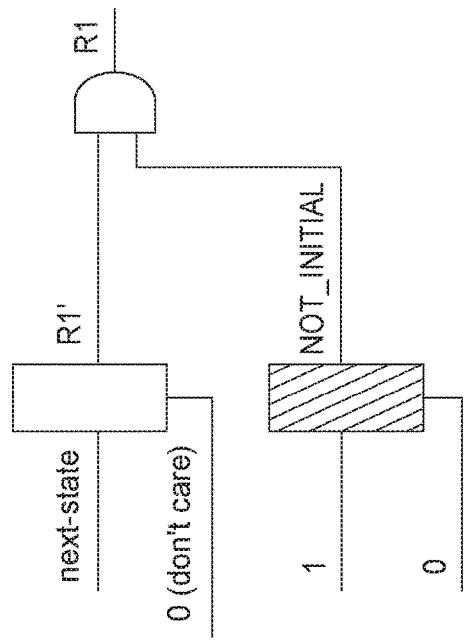
FIG. 1C
FIG. 1D

400

```
IDENTIFY A MULTIPLEXOR SELECTED BY ONE OF THE CONSTANT
NEXT-STATE FUNCTION REGISTERS IN THE FIRST SET OR ITS         ~ 405
INVERSE, WITH EITHER DATA INPUT BEING THE AT LEAST ONE
REDUCIBLE REGISTER OR ITS INVERSE
```

```
MODIFY THE INITIAL VALUE OF THE AT LEAST ONE REDUCIBLE REGISTER
TO REFLECT THE OBSERVABLE VALUE OF THE AT LEAST ONE            ~ 410
REDUCIBLE REGISTER
```

```
MOVE FAN-OUT REFERENCE OF THE MULTIPLEXOR ONTO THE
AT LEAST ONE REDUCIBLE REGISTER AND ELIMINATE THE         ~ 415
MULTIPLEXOR FROM THE NETLIST
```

FIG. 4

INITIAL-STATE AND NEXT-STATE VALUE FOLDING

BACKGROUND

The present invention relates to scaling logic verification, and more specifically, to simplifying a netlist by leveraging sequential unobservability conditions to eliminate gates by altering initial-value and next-state functions.

Contemporary hardware designs are typically complex and include a diversity of different logic such as bit-level control logic, data paths of various types (e.g., including pipeline stages, queues, and RAM) with error identification logic, performance related artifacts (e.g., pipelining, multi-threading, out-of-order execution, and power saving techniques), and pervasive logic artifacts used to initialize the design, monitor its runtime execution, and detect and cope with faults. While verifying hardware designs is necessary, the increased complexity of hardware designs has made verification more difficult.

Such designs are further complicated by the multi-dimensional optimization criteria including delay, area, and power—as well as the inclusion of logic to increase testability, reliability, and configurability. The verification of such complex systems has grown to be extremely challenging if not intractable, with verification resource demands having eclipsed the cost of all other aspects of the production of such systems, while nevertheless often entailing the risk of missed subtle design flaws. Such design flaws—especially in hardware—can be exorbitantly expensive to repair if exposed late, cause product delays, and risk serious damage due to erroneous computations.

Verification generally entails exponentially-growing complexity with respect to the size of the design under verification. Some verification techniques are more seriously hindered by certain design components than others. For example, techniques that leverage a canonical representation of design functionality may be more hindered by the number of primary inputs of the design than other size metrics—since a functional view (e.g., a truth table) is exponential in size with respect to the number of inputs. The number of gates of a design often imposes a significant impact on the complexity of analysis of the design functionality, since this often means that design function is often more complicated.

Techniques that reason about reachable states of a design are often highly impacted by the number of state elements of the design. Techniques which can reduce the size of the design under verification often make a tremendously positive impact on the tractability of the verification task. Such techniques can significantly reduce the expense of verification and thus production of a logic design, reducing the risk of missed bugs while enabling verification plan closure with less effort. Certain reduction techniques can furthermore be used in a synthesis setting, to reduce area and power of a logic circuit.

SUMMARY

According to one embodiment of the present invention, a method for reducing a size of a netlist includes determining a first set of registers having constant next-state functions in the netlist. The method includes identifying an observable gate in fan-out of a register in the first set, wherein an observable gate is a gate that is critical to a verification or synthesis context. The method includes identifying a second set of reducible registers in the fan-in of the observable gate. The method includes modifying at least one of an initial value and a next-state function of at least one reducible register of the second set to reflect an observable value of the at least one reducible register observed at the observable gate. The method includes simplifying one or more logic gates implementing the observable gate and the fan-in of the observable gate by eliminating a reference to a constant next-state function register in the first set of registers.

According to one embodiment of the present invention, a computer program product for reducing a size of a netlist comprises a computer-readable storage medium having computer-readable program code embodied therewith, the computer-readable program code executable by one or more computer processors to perform an operation comprising: determining a first set of registers having constant next-state functions in the netlist; identifying an observable gate in fan-out of a register in the first set, wherein an observable gate is a gate that is critical to a verification or synthesis context; identifying a second set of reducible registers in the fan-in of the observable gate; modifying at least one of an initial value and a next-state function of at least one reducible register of the second set to reflect an observable value of the at least one reducible register observed at the observable gate; and simplifying one or more logic gates implementing the observable gate and the fan-in of the observable gate by eliminating a reference to a constant next-state function register in the first set of registers.

According to one embodiment of the present invention, a computing system determines a first set of registers having constant next-state functions in the netlist. The computing system identifies an observable gate in fan-out of a register in the first set wherein an observable gate is a gate that is critical to a verification or synthesis context. The computing system identifies a second set of reducible registers in the fan-in of the observable gate. The computing system modifies at least one of an initial value and a next-state function of at least one reducible register of the second set to reflect an observable value of the at least one reducible register observed at the observable gate. The computing system simplifies one or more logic gates implementing the observable gate and the fan-in of the observable gate by eliminating a reference to a constant next-state function register in the first set of registers.

BRIEF DESCRIPTION OF THE SEVERAL VIEWS OF THE DRAWINGS

FIG. 1A is a logical representation of a register in a netlist, according to an embodiment.

FIG. 1B represents a less compact yet behaviorally equivalent form of the register R1 of FIG. 1A.

FIG. 1C represents a version of FIG. 1B where the initial value of R1 is constant 0.

FIG. 1D represents a version of FIG. 1C where the initial value of R1 is constant 1.

FIG. 4 illustrates one embodiment of a sub-method of FIG. 3 that implements the modifying step and the simplifying step when the single-output cut implements a multiplexor, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1E:
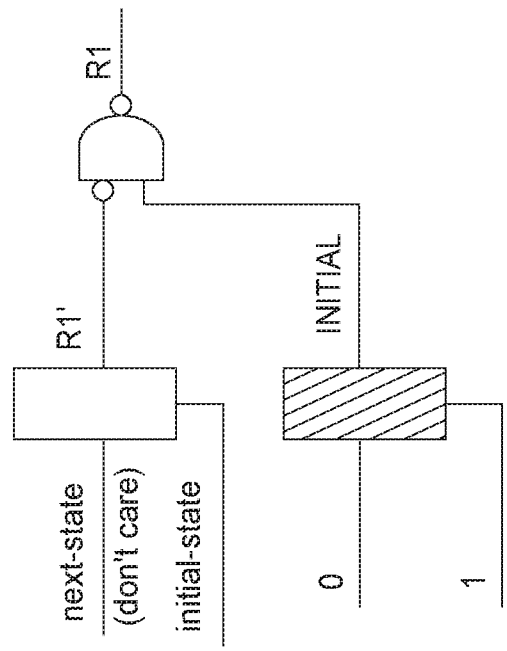
FIG. 1E represents a less compact version of FIG. 1A where the next-state function of R1 is constant 0.

A "testbench" refers to the composition of a design under verification along with a synthesized variant of any input assumptions and properties to check. "Equivalence checking" refers to a type of verification which attempts to establish functional equivalence of the outputs of two designs under identical input stimulus. Embodiments of the present disclosure reduce the complexity of verification through reducing the size of the testbench via folding initial-value related logic. Specifically, an embodiment of the present disclosure identifies logic which behaves as a constant at time 0 or after time 0, and uses this information to optimize logic in a region about a register under examination. A logic register under examination, its fan-out, and its fan-in (e.g., those gates that are reachable from the gate being examined via traversing gate outputs, or gate inputs, respectively) may be folded or reduced from a more complex representation to a similar representation, thus simplifying a corresponding netlist of the testbench to a simpler form. This technique is a highly-scalable algorithm which can be bounded to linear runtime with respect to testbench size.

The technique above is modeled as a component of a transformation-based verification system, such that this approach can benefit in utility from the application of prior transformations. Similarly, subsequent transformations may be significantly more effective after this transform, and generally there may be value from iterating this transform with other optimization techniques to yield increasing reductions.

Embodiments of the present disclosure further present a method to identify logic that is constant after time 0. The method identifies state variables which may be simplified given time-0 or post-time-0 constant logic, and simplifies a corresponding netlist accordingly. In a verification context, the benefits of this technique include (i) a reduction in the number of combinational gates, (ii) a reduction on the number of fan-out references to certain state variables—or a migration of more logic from being "sequentially driven" to being "combinationally driven", which enables more efficient reasoning and reduction capability through other transforms, and (iii) a reduction in the number of certain state variables. The embodiments herein can also be used for area, power, and delay reduction in a synthesis flow. As such, the techniques described herein are valuable to hardware development companies, as well as to CAD company licensing verification or synthesis tools.

A netlist can be represented as a Boolean network. A Boolean network can be expressed in the form of an And-Inverter Graph (AIG). The netlist contains a directed graph with vertices representing gates, and edges representing interconnections between those gates. Each gate has zero or more input edges, indicating which gates define their semantic behavior, and zero or more output edges, indicating that other gates have their semantic behavior defined by this gate. Each gate has an associated function, such as constants, primary inputs (hereafter referred to as RANDOM gates), combinational logic such as AND gates, simple sequential elements (hereafter referred to as registers), and memory arrays. In embodiments, a netlist format is defined, which is used to represent logic systems under verification.

Registers have two associated components: their next-state functions, and their initial-value functions. Both are represented as other gates in the graph. Semantically, for a given register, the value appearing at its initial-value gate at time "0" ("initialization" or "reset" time) will be applied as the value of the register itself, the value appearing at its next-state function gate at time "i" will be applied to the register itself at time "i+1". The initial value of register "r" may be referred to as "initial-value(r)" and the next-state function of "r" as "next-state(r)"

The primary inputs (PIs) of the network representing the netlist are gates without fan-ins. The primary outputs (POs) are a subset of the gates of the network. A gate "g" has zero or more "fan-ins", i.e., gate that are driving this gate, and zero or more "fan-outs," i.e., gates driven by this gate. The fan-out of gate "g" represents the set of gates whose input includes "g". Transitive fan-out refers to the fan-out of a gate, as well as the fan-out of the fan-out of the gate, etc. The fan-in of a gate refers to those gates at its inputs. Transitive fan-in refers to the fan-in of a gate, as well as the fan-in of the fan-in of the gate, etc. To "merge" one gate onto another refers to moving all fan-out edges from the former gate to the latter gate, such that the former gate may be eliminated from the netlist. A "cut" of gate "g" in the graph representing the netlist, called a root, is defined a set of gates, called leaves, such that each path from a PI primary input to the gate "g" passes through at least one leaf. Stated differently, a "cut" of the gate "g" is a set of gates through which every directed path between a fan-in of g and a fan-out of gate "g" passes. A fan-in (fan-out) cone of gate "g" is the subset of the gates of the network reachable through the fan-in (fan-out) edges from gate "g". Internal flexibilities of a node arise because of limited controllability and observability of the node A "trace" represents a sequence of valuations to the gates of a netlist over time, beginning from an initial state and consistent with the semantics of the gates. In a verification context, certain gates are labeled as "properties", representing a verification objective where the goal is to find a trace showing a logical "1" applied to the property gate, or to prove that no such assertion of the property is possible. Certain gates may be labeled as "constraints", where any legal trace illustrating a property violation must satisfy (evaluate to 1) every constraint for every timestep in the trace. It will be noted that a netlist is a self-contained representation of a verification testbench within a verification setting, comprising a composition of the design under verification with any relevant properties and input assumptions.

In a verification setting, "externally-visible" gates refer to property and constraint gates, whose values are essential to a verification tool. In a logic synthesis setting, the "externally-visible" gates would include primary outputs of a design, as the values of primary outputs of design components are essential to the behavior of the overall hardware system. Hereafter, the set of all gates whose function is essential to preserve in verification or synthesis is referred to as "observable gates." Certain embodiments sometimes refer to an observable gate or set of observable gates in the fan-out of candidate reducible registers. For the netlist transformations described herein to be valid in verification or synthesis contexts, it is required that they do not alter the behavior of the externally-visible gates. This is guaranteed by requiring that the selected observable gates used to optimize a particular reducible register comprise a cut between that reducible register and externally-visible gates. The described method often preserves the behavior of observable gates in closer proximity to candidate reducible registers than the externally-visible gates.

More particularly, a transform must preserve behavior of these externally-visible gates. Though certain embodiments preserve the behavior of a larger set of gates by selecting additional observable gates local to the constant next-state function registers and reducible registers. By guaranteeing to preserve the behavior of these local observable gates, and by ensuring that these local observable gates constitute a cut between modified reducible registers and externally-visible gates, the behavior of the externally-visible gates is guaranteed to be preserved. The value of reducible registers observed at the local observable gates is directly used to modify the reducible registers, and simplify logic in the fan-in of the observable gates.

Non-controllability occurs because some combinations of values are never produced at the fan-ins. Non-observability occurs because the gate's effect on the POs is blocked under some combination of the PI values. These internal flexibilities result in don't-cares at the gate "g". Don't-cares can be represented by a Boolean function whose inputs are the fan-ins of the gate "g" and whose output is 1 when the value produced by the gate "g" does not affect the functionality of the netlist. The complement of this function gives the care set. Subsets of don't-cares are derived and used to optimize a gate. This optimization may involve minimizing the gate's function in isolation from other gates. The transformation is known as don't-care-based optimization, which is employed in embodiments of the present disclosure. The netlist reduction method/system of the present disclosure is operable to leverage sequential unobservability conditions to eliminate gates via altering initial-value and next-state functions.

FIG. 1A is a logical representation of a register 100 in a netlist, according to an embodiment. Register "R1" in FIG. 1A is depicted as a rectangle. The edge at the right of R1 denotes an output edge (a reference to the register's current value). The edge at the left of R1 is an input edge denoting its next-state function. The edge at its bottom of R1 denotes its initial-value function.

FIG. 1B represents a less compact yet behaviorally equivalent form of the register R1 of FIG. 1A. FIG. 1B includes the register R1', and a multiplexor (MUX) sourcing output edge R1—which is behaviorally equivalent to R1 in FIG. 1A. The multiplexor MUX is the trapezoid in the figure, implementing function "if (bottom input edge) then (bottom left input edge) else (top left input edge)". The bottom input edge is sometimes referred to as the "selector" of the multiplexor MUX, as the bottom input edge selects which data input is propagated to the output of the multiplexor MUX. Note that the selector of the multiplexor MUX, the bottom input edge, is driven by a new register whose initial value is 0, next-state function is 1, and whose output edge is inverted (denoted by the bubble at the source of the output edge). This inverted output edge is denoted "INITIAL", whose function is 1 at time 0 and 0 thereafter. This causes the multiplexer MUX to drive value "initial-state" at time 0, and the output R1' thereafter.

Register R1' has the same next-state function "next-state" as R1 in FIG. 1A, and an unimportant initial value (a don't care, here a 0) since this initial value is not visible at edge R1'. FIG. 1A represents an ideal minimal form in an overall netlist compared to the implementation of FIG. 1B, since FIG. 1A requires one fewer register and one fewer combinational gate to implement. In an And/Inverter Graph representation, the multiplexor MUX requires three gates to implement, so FIG. 1A requires one fewer register and three fewer gates to implement. FIG. 1C represents a version of FIG. 1B where the initial value of R1 is constant 0, whereas FIG. 1D represents a version of FIG. 1C where the initial value of R1 is constant 1. Both FIG. 1C and FIG. 1D require one more register and one more combinational gate to implement vs. FIG. 1A. The justification for calling and output of register R1 as "INITIAL" is that the signal is true at time 0 (initialization time), and false at other times—so NOT_INITIAL would be an intuitive complement of the latter as labeled in FIGS. 1C and 1D.

Figure 1F:
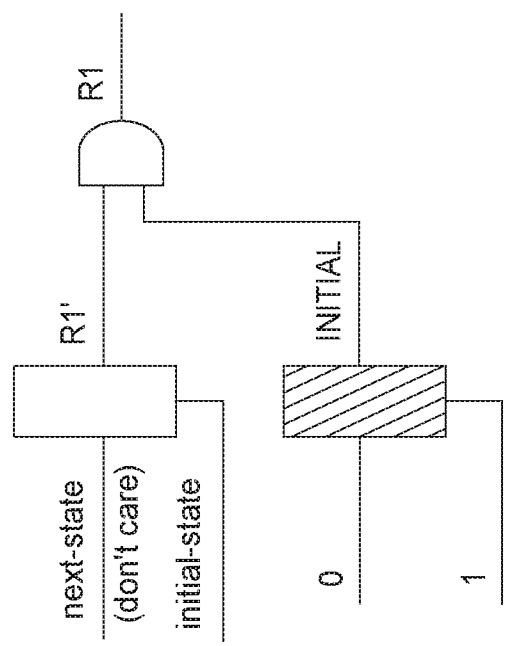
FIG. 1F represents a less compact version of FIG. 1A where the next-state function of R1 is constant 1.

FIG. 1E represents a less compact version of FIG. 1A where the next-state function of R1 is constant 0, whereas FIG. 1F represents a less compact version of FIG. 1A where the next-state function of R1 is constant 1. Both FIG. 1E and FIG. 1F require one more register and one more combinational gate to implement vs. FIG. 1A.

In embodiments of the present disclosure, registers in the netlist that can be modeled as the registers of FIGS. 1B-1F are reduced or merged to the representation of FIG. 1A.

Below is a listing of pseudo code which implements the netlist reduction method of the present disclosure.

1. function fold_initial_values(netlist N)
{
2. inits=set of registers with constant next-state functions in netlist "N";
3. for each "init" in "inits" {
4. "A"=empty set
5. for each gate "g" in the fan-out of "init" {
// Note: lines 6-14 attempt to reduce single-output cuts between reducible registers "r" and observable gates. Lines 15-25 attempt to reduce multi-output cuts
6. if("g" constitutes a single-output cut between any fan-in register "r" and "observable gates") {
7. if("g" implements a mux selected by "init*" with either data input being register "r*")
{// notation 'n*' means "a reference to gate 'n' or the inversion of 'n'"

8. modify initial-value(r) to reflect time-0 observable value at "g"; merge "g" onto "r"; continue // converts FIG. 1B to FIG. 1A
}
9. if("g" is an AND gate of form "init* & r*") {
10. modify initial-value(r) to reflect time-0 observable value of "g"; if the time-i for i>0 value of "g" is constant modify next-state(r) to this constant; merge "g" onto "r"; continue //converts FIGS. 1C-1F to FIG. 1A
11. }
12. if("g" is an AND gate of form "init* & r* & OTHER") {
13. modify initial-value(r) to reflect time-0 observable value of "g"; if the time-i for i>0 value of "g" is constant modify next-state(r) to this constant; merge "g" onto "r* & OTHER"; continue // generalizes simplify_and1 for single-output logic cones in the fan-out of reducible register "r" with more logic between "g" and "r"
14. }
15. push "g" to "A" // will attempt multi-output reduction below
16. } // end if "g" constitutes a single-output cut
17. } // end for each gate "g" in the fan-out of "init"
18. if("A" is not empty) {
19. enumerate registers "R" in the AND-tree fan-in of "A" other than init*, which for which "A" constitutes a cut between "R" and "observable gates"
20. compute minimal subset "minimalRegs" of "R" which covers the bipartite graph between "R" and "A"
21. for each gate "a" in "A" {// by construction "a" is an AND gate of form "init* & r* & OTHER", where OTHER is possibly empty
22. select "r" from "minimalRegs" which covers "a"
23. modify initial-value(r) to reflect time-0 observable value of "a"; if the time-i for i>0 value of "a" is constant modify next-state(r) to this constant; merge "a" onto "r* & OTHER"; continue
23. }
24. }
25. } // end for each "init" in "inits"
26. for each register "r" modified in lines 8, 10, 13, or 23 {
27. if initial-value(r) references any registers, clone initial-value(r) inlining the initial-value of referenced registers in place of these register references to yield gate "clone"; replace initial-value(r) by "clone";
28. }
29. }

Line 2: "inits" refers to detecting "Initialization" Registers. Line 2 is a function that provides a technique to identify registers whose next-state functions are a constant 0 or constant 1, regardless of their initial value. Embodiments of the present disclosure operate by simplifying other "reducible" registers whose time-0, or time-i for all i>0, behavior is masked by the "initialization" registers. Note that there is no assumption placed on the initial value of an initialization register; the initial value can be arbitrary, either constant or even a symbolic value defined by another gate in the netlist.

Lines 5-25: For each gate in the fan-out of an "inits" register found, the netlist main reduction algorithm is executed. Lines 6-25 attempt to simplify logic in the region of each initialization register, using several secondary sub-methods that each attempts a qualitatively different type of reduction. Lines 6-8 iterate one level deeper toward fan-outs, looking for multiplexor or "mux" functionality. Lines 9-14 attempt to reduce single-output cuts between reducible registers "r" and observable gates. Lines 15-25 attempt to reduce multi-output cuts.

While "init" registers constitute the basis of this transform, the actual netlist reduction is achieved relative to the AND gates in the fan-out of "init" registers, through modifying the initial state or next-state function of reducible registers other than "init" in the fan-in of these AND gates. These fan-out gates are treated as observable gates, and the reducible registers are transformed according to the values observable at the observable gates at time 0, and times i>0. Furthermore, these observable gates can be eliminated or simplified after modifying the reducible registers, to eliminate their fan-in reference to the "init" registers while preserving the behavior of the modified observable gates. Note that registers other than "init", or other gates, may be referenced inverted in the "AND-tree fan-in"—as inverted gate references always constitute termination points of AND-tree fan-in searches. This netlist simplification transformation leverages the observability restrictions imposed by "initialization" registers on these fan-out AND gates, to reduce local logic size while preserving behavior of the externally-visible gates. This requires that the AND gates analyzed for the reduction constitute a "cut" between modified registers and the externally-visible gates.

It is often desired in verification and synthesis that the "initial value" logic be purely combinational, e.g., does not refer to any registers. Such "sequential initialization" can reduce the effectiveness of a variety of verification algorithms, and result in a complicated "synthesis" mechanism to translate into on-chip design initialization mechanisms. There is a risk that the above transforms can convert some purely-combinational initial values to sequential ones, when modifying latch initial values. Lines 26-29 provide a method to "legalize" sequential initialization functions into purely combinational ones. The method does this by cloning the initial values of any registers with sequential initialization, and replacing the instantiation of any registers on that clone with the initial values of the instantiated logic. This method is guaranteed to render an acyclic consistent combinational initial value, as long as the original netlist was free from "combinational cycles" itself.

Figure 2:
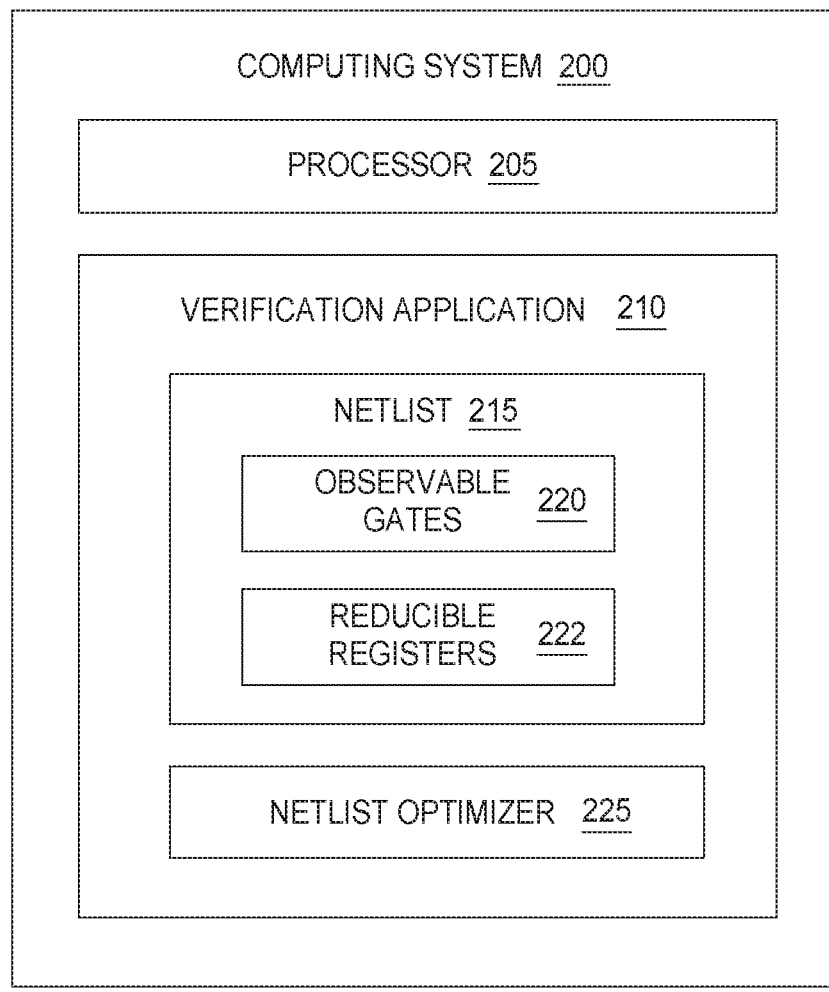
FIG. 2 illustrates a computing system for reducing the size of a netlist being verified, according to one embodiment.

FIG. 2 illustrates a computing system 200 for reducing the size of a netlist 215 being verified, according to one embodiment described herein. The computing system 200 includes a processor 205 and a verification application 210. The processor 205 represents one or more processing elements that each may include multiple processing cores. Using the processor 205, the verification application 210 can evaluate the netlist 215 to reduce its size by leveraging sequential unobservability conditions to simplify (reducible) registers whose time-0, or time-i for all i>0, behavior is masked by "initialization" registers. Additionally, (lines 26-29 of the pseudo-code) the verification application 210 includes the netlist optimizer 225 which converts the netlist 215 to a simpler form by identifying any modified initial value functions which contain registers in their fan-in (i.e., are sequentially defined), then modifying these sequentially-defined initial value functions to combinationally-defined (means "not referencing a register") by replicating the (observable) gates 220 in the modified initial value functions and replacing all references to registers 222 in this replicated logic to references to the initial value functions of referenced registers 222.

Figure 3:
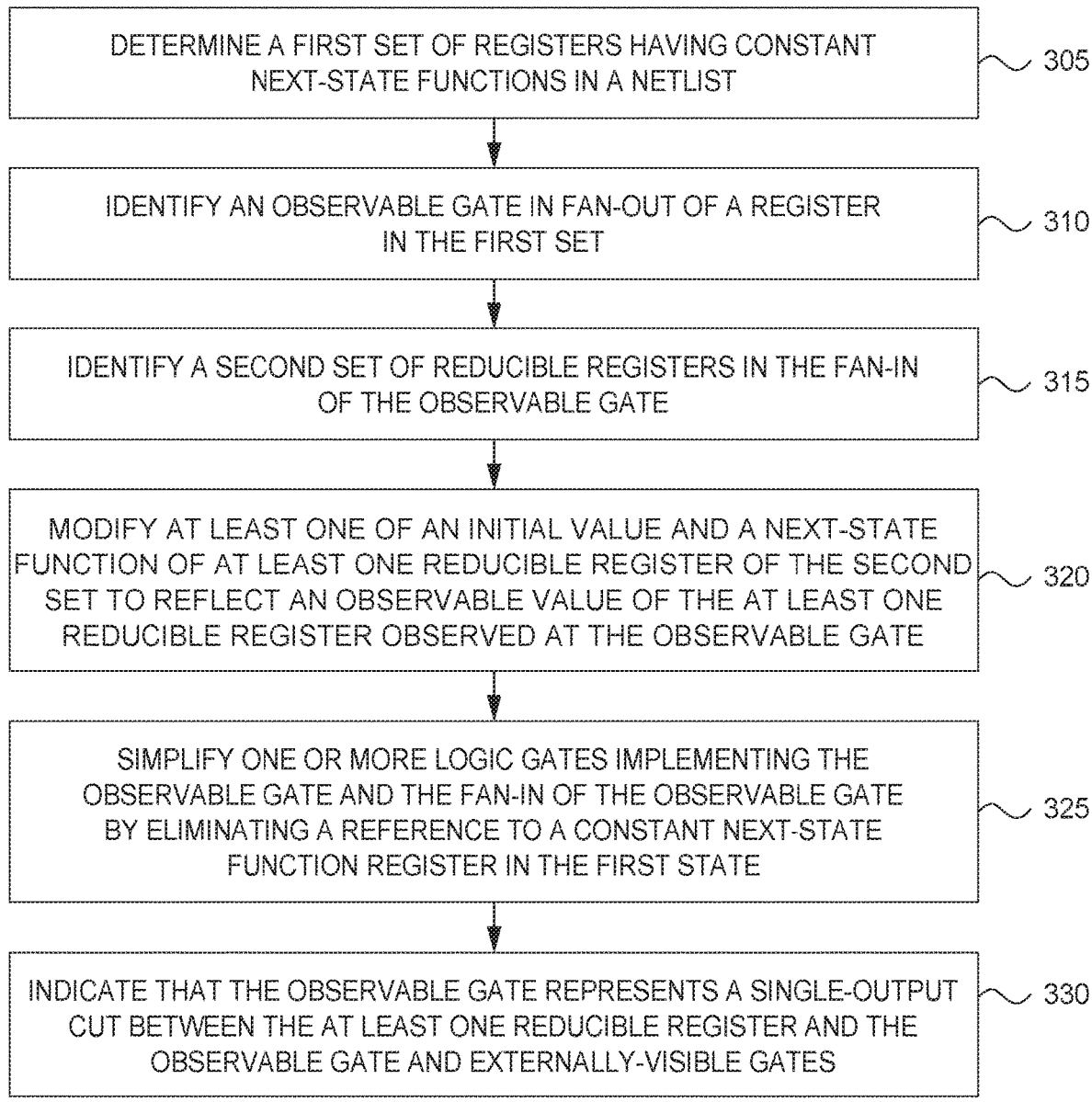
FIG. 3 is a flow chart illustrating one embodiment of a method for reducing the size of a netlist by leveraging sequential unobservability conditions to simplify registers whose time-0, or time-i for all i>0 behavior is masked by "initialization" registers, according to one embodiment.

FIG. 3 illustrates one embodiment of a method 300 for reducing the size of a netlist 215 by leveraging sequential unobservability conditions to simplify registers 222 whose time-0, or time-i for all i>0, behavior is masked by "initialization" registers 222. Method 300 can be performed by processing logic that can comprise hardware (e.g., circuitry, dedicated logic, programmable logic, microcode, etc.), software (e.g., instructions run on a processing device), or a combination thereof. In one embodiment, method 300 is performed by the netlist optimizer 225 of FIG. 2.

At block 305, the netlist optimizer 225 determines a first set of registers having constant next-state functions in the netlist 215. For example, as shown in FIGS. 1B-1F, a register can have next-state functions that are a constant 0 or constant 1, regardless of their initial value; such constant next-state function registers are referred to as initialization registers or inits. Embodiments of the present disclosure operate by simplifying other registers whose time-0, or time-i for all i>0 behavior is masked by the initialization registers. In one embodiment, block 305 implements line 2 of the above referenced pseudocode.

At block 310, the netlist optimizer 225 identifies an observable gate 220 in fan-out of a register in the first set 130 wherein an observable gate is a gate that is critical to a verification or synthesis context. As per algorithm fold_initial_values, observable gates are selected so as to enable a specific reductions such as multiplexor reduction (lines 7-8), single-output AND gate cut reduction (lines 9-11 or 12-14), or multi-output cuts (lines 15-25). In one embodiment, at block 310 the netlist optimizer 225 finds a set of gates in the fan-out of the set of initialization registers relative to which reducible registers are to be modified. The netlist optimizer 225 in turn allowing this fan-out set of registers to be simplified (e.g., reducible registers, reducible from forms of FIG. 1B-1F to the form of FIG. 1A) either by directly merging onto modified reducible registers, or by simplifying the logic implementing these fan-out gates to eliminate their reference to the initialization registers. As demonstrated in algorithm fold_initial_values, by selecting fan-out observable gates locally to the region of the identified initialization register 305, the identified fan-in registers are all reducible using one of the following specific described transformations, and thus are termed "reducible registers." These transformation can include (i) implementing multiplexors selected by a given initialization register, or reachable only through AND tree fan-out traversal where only terminal points (but no internal edges) may be inverted; (ii) identifying registers other than the initialization register reachable in the fan-in of the selected observable gates which are data inputs to the selected observable multiplexor or reachable only through AND tree fan-in traversal where only terminal points may be inverted. These fan-out gates constitute a cut between reducible registers and externally-visible gates predefined in the netlist, e.g. primary outputs or verification properties.

At block 315, the netlist optimizer 225 identifies a second set of reducible registers 140 in the fan-in of the observable gate 220. As noted above, the set of all gates whose function is needed to preserve in verification or synthesis are referred to as "observables" and are a superset of the externally-visible gates.

More particularly, the reason analysis is limited to un-inverted AND tree fan-in and fan-out traversal is to guarantee simplification of the resulting observable gates in one of the described methods (lines 7-8, lines 9-11, lines 12-14, or lines 15-25 of the above-referenced pseudo code). Multiplexor handling is slightly different, since the And/Inverter Graph implementation of a multiplexor has internal inversions in specific places. All registers encountered in the fan-in of observable gates selected in this way, reachable via fan-in analysis only by the specific multiplexor rules or only by AND tree traversal with inversions only allowed at terminal points, are all "reducible registers" by construction.

"Reducible registers" thus means registers whose initial-value and next-state functions can be modified reflecting values observed at the observable gate, after which the implementation of the obsevable gate may be simplified while preserving the behavior of the observable gate. By ensuring the observable gate(s) form a cut of the fan-out between the modified reducible register and externally-visible gates, the behavior of the overall netlist and verification/synthesis flow is preserved.

At block 320, the netlist optimizer 225 modifies at least one of an initial value and a next-state function of at least one reducible register of the second set to reflect an observable value of the at least one reducible register 222, observed at the selected observable gate. At block 325, the netlist optimizer 225 simplifies one or more logic gates implementing the observable gate 220 and the fan-in of the observable gate 220 by eliminating a reference to a constant next-state function register in the first set. At block 330, the netlist optimizer 225 indicates that the observable gate 220 represents a single-output cut between the at least one reducible register 222 and the observable gate 220 and externally-visible gates.

The blocks 320 and 325 attempt to simplify logic in the region of each initialization register, using several secondary functions that each attempt a qualitatively different type of reduction. Examples of these modifying and simplifying secondary functions are illustrated as sub-methods 400-700 in FIGS. 4-7 to be applied to different types of gates and cuts. Sub-method 400 looks for multiplexor or "mux" functionality, implemented by lines 6-8 of the above-referenced pseudo code. Sub-methods 500 and 600 modify and simplify immediate fan-out AND gates of each initialization register, sub-methods 500 and 600 simplify single-output cuts between reducible registers and observable gates. Sub-method 700 iterates one level deeper with respect to fan-outs, operating arbitrarily deeper by scanning maximally-sized AND tree roots. Sub-method 700 implements lines 15-25 of the pseudo-code. This is accomplished by traversing each fan-out connection from an initialization register, stopping each traversal once an observable gate is reached, or if an inverted edge is traversed. Note this traversal does not terminate on an immediate fan-out edge of an "init" itself, regardless of whether this edge is inverted. The result of this traversal is a set of AND tree roots. In practice, sub-method 700 is most effective if it is iteratively repeated for each fan-out of "init"—from the immediate AND gate in the fan-out of "init" to deeper and gates which still constitute an AND tree including "init" as a leaf.

While "init" registers constitute the basis of this transform, the actual netlist reduction is achieved relative to the observable AND gates in the fan-out of "init" registers, through modifying the initial state or next-state function of reducible registers other than "init" in the fan-in of these AND gates. Note that registers other than "init", or other gates, may be referenced inverted in the "AND-tree fan-in"—as inverted gate references constitute termination points of AND-tree fan-in searches. Because method 300 leverages observability restrictions imposed by "initialization" registers, it is necessary that the AND gates analyzed for this reduction constitute a "cut" between modified registers and the observable gates.

FIG. 4 illustrates one embodiment of a sub-method 400 that implements the modifying step 320 and the simplifying step 325 of method 300 when the single-output cut implements a multiplexor. Method 400 implements lines 6-8 of the above referenced pseudocode. At block 405, the netlist optimizer 225 identifies the multiplexor selected by one of the constant next-state function registers in the first set or its inverse (of the constant next state function registers in the first set), with either data input being the at least one reducible register 222 or its inverse (of the at least one reducible register 222). At block 410, the netlist optimizer 225 modifies the initial value of the at least one reducible register 222 to reflect the observable value of the at least one reducible register 222. At block 415, the netlist optimizer 225 moves fan-out references of the observable gate 220 onto the at least one reducible register 222 and eliminates the observable gate 220 from the netlist 215.

Figure 5:
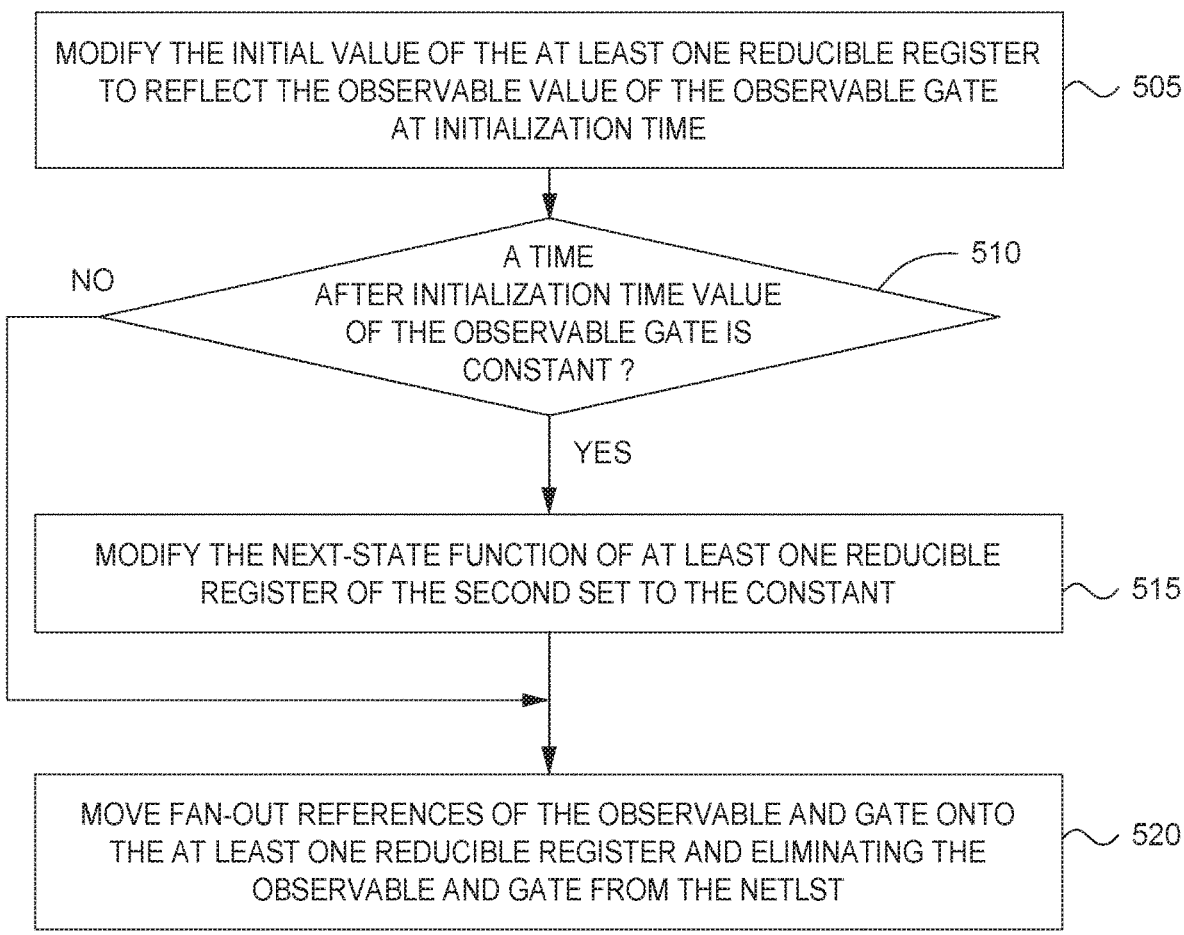
FIG. 5 illustrates one embodiment of a sub-method of FIG. 3 that implements the modifying step and the simplifying step when the single-output cut implements an observable AND gate from constant next-state function registers in the first set or its inverse and the at least one reducible register or its inverse, according to one embodiment.

FIG. 5 illustrates one embodiment of a sub-method 500 that implements the modifying step 320 and the simplifying step 325 of method 300 when the single-output cut implements an observable AND gate 220 from constant next-state function registers in the first set or its inverse (of the constant next-state function registers in the first set) and the at least one reducible register 222 or its inverse (of the at least one reducible register 222). Method 500 implements a portion of lines 9-11 of the above referenced pseudocode. At block 505, the netlist optimizer 225 modifies the initial value of the at least one reducible register 222 to reflect the observable value of the observable gate 220 at initialization time. At block 510, if a time after initialization time value of the observable gate 220 is constant, then at block 515, the netlist optimizer 225 modifies the next-state function of at least one reducible register 222 of the second set to the constant. At block 510, if a time after initialization time value of the observable gate 220 is not constant, then execution proceeds to block 520. At block 520, the netlist optimizer 225 moves fan-out references of the observable AND gate 220 onto the at least one reducible register 222 and eliminates the observable AND gate 220 from the netlist 215.

Figure 6:
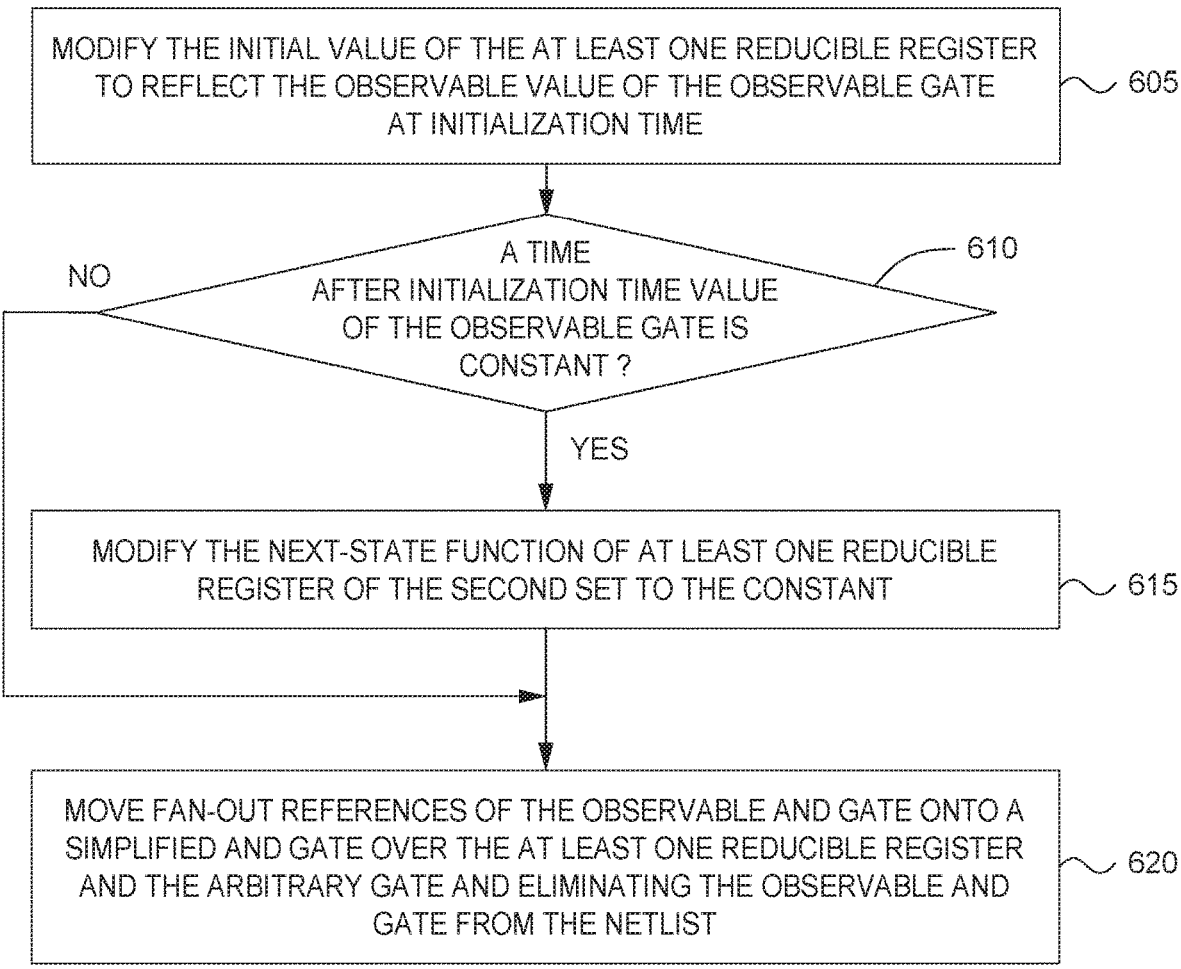
FIG. 6 illustrates one embodiment of a sub-method of FIG. 3 that implements the modifying step and the simplifying step of when the single-output cut implements an observable AND gate of a form of a constant next-state function registers in the first set or its inverse, the at least one reducible register or its inverse, and an arbitrary gate in the netlist, according to one embodiment.

FIG. 6 illustrates one embodiment of a sub-method 600 that implements the modifying step 320 and the simplifying step 325 of method 300 when the single-output cut implements an observable AND gate 220 of a form of a constant next-state function registers in the first set or its inverse (of the constant next-state function registers in the first set), the at least one reducible register 222 or its inverse (of the at least one reducible register 222), and an arbitrary gate in the netlist 215. Method 600 implements lines 12-14 of the above referenced pseudocode. At block 605, the netlist optimizer 225 modifies the initial value of the at least one reducible register 222 to reflect the observable value of the observable gate 220 at initialization time. At block 610, if a time after initialization time value of the observable gate 220 is constant, then at block 615, the netlist optimizer 225 modifies the next-state function of at least one reducible register 222 of the second set to the constant. At block 610, if a time after initialization time value of the observable gate 220 is not constant, then execution proceeds to block 620. At block 620, the netlist optimizer 225 moves fan-out references of the observable AND gate 220 onto a simplified AND gate over the at least one reducible register 222 and the arbitrary gate and eliminates the observable AND gate 220 from the netlist 215.

Figure 7:
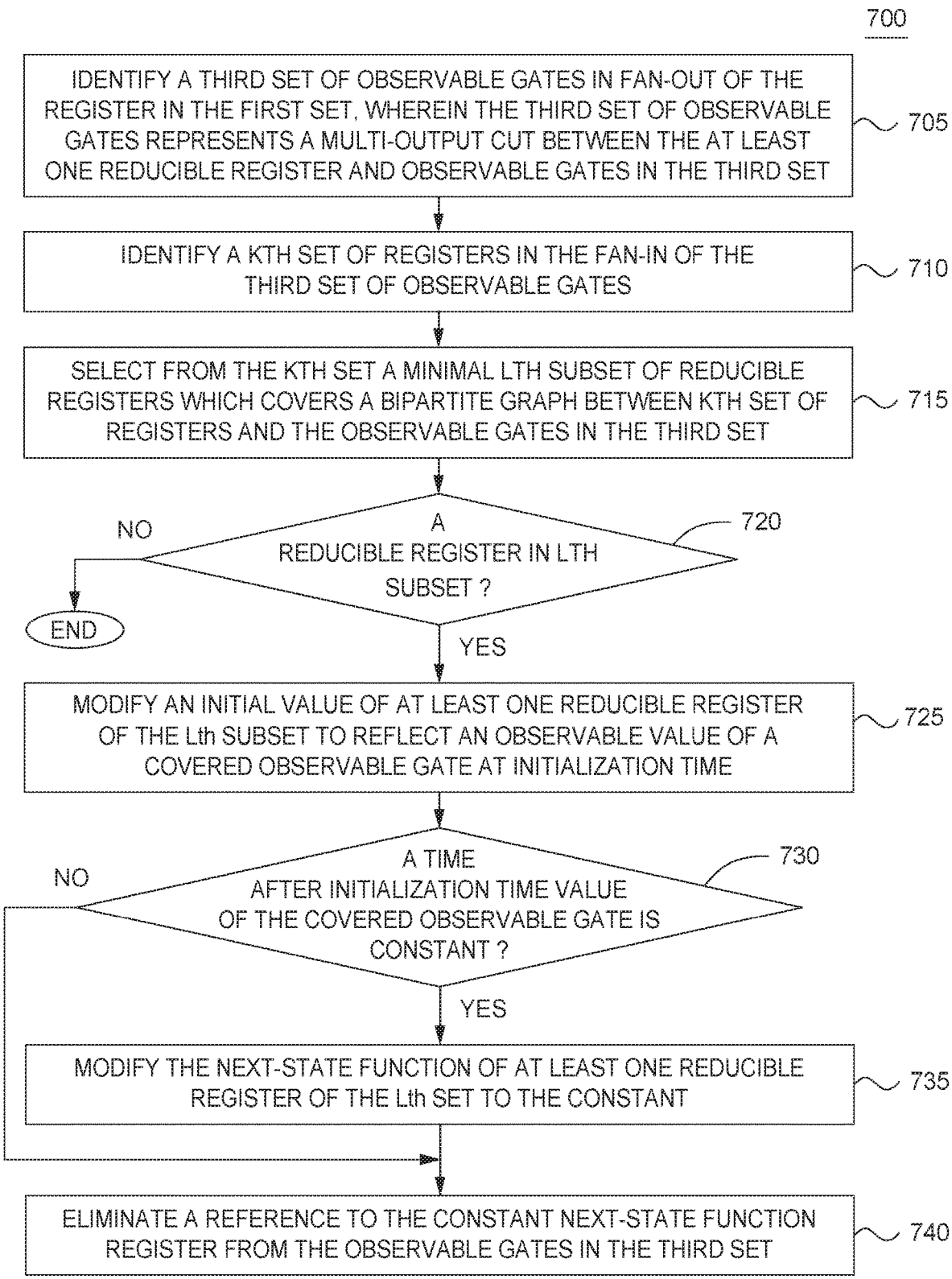
FIG. 7 illustrates one embodiment of a sub-method of FIG. 3 that implements the modifying step and the simplifying step when the netlist optimizer identifies a third set of observable gates in fan-out of the register in the first set which represents a multi-output cut between the at least one reducible register and observable gates in the third set, according to one embodiment.

FIG. 7 illustrates one embodiment of a sub-method 700 that implements the modifying step 320 and the simplifying step 325 of method 300 when, at block 705, the netlist optimizer 225 identifies a third set of observable gates 220 in fan-out of the register in the first set which represents a multi-output cut between the at least one reducible register 222 and observable gates 220 in the third set. Method 700 implements lines 15-25 of the above referenced pseudocode. At block 710, the netlist optimizer 225 identifies a Kth set of registers in the fan-in of the third set of observable gates 220. At block 715, the netlist optimizer 225 selects from the Kth set a minimal Lth subset of reducible registers 222 which covers a bipartite graph between Kth set of registers and the observable gates 220 in the third set. At block 720, for each reducible register 222 in Lth subset, blocks 720-740 are executed. At block 725, the netlist optimizer 225 modifies an initial value of at least one reducible register 222 of the Lth subset to reflect an observable value of a covered observable gate 220 at initialization time. At block 730, if a time after initialization time value of the covered observable gate 220 is constant, then at block 735, the netlist optimizer 225 modifies the next-state function of at least one reducible register 222 of the Lth set to the constant. At block 730, if a time after initialization time value of the covered observable gate 220 is not constant, then execution proceeds to block 740. At block 740, the netlist optimizer 225 eliminates a reference to the constant next-state function register from the observable gates 220 in the third set.

Figure 8:
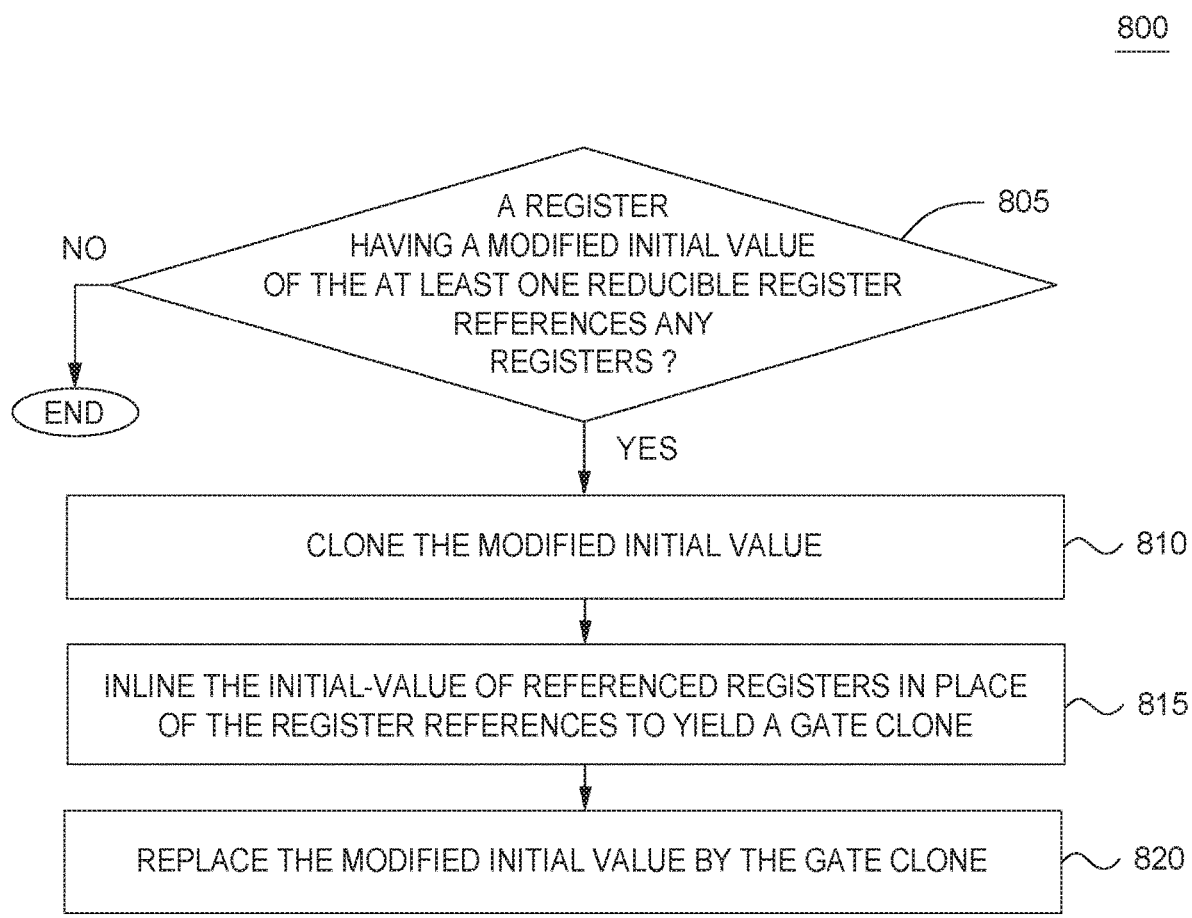
FIG. 8 illustrates one embodiment of a method that "legalizes" sequential initialization functions into purely combinational functions, according to one embodiment.

FIG. 8 illustrates one embodiment of a method 800 that "legalizes" sequential initialization functions into purely combinational functions. Method 800 implements lines 26-29 of the above referenced pseudocode. Method 800 can be performed by processing logic that can comprise hardware (e.g., circuitry, dedicated logic, programmable logic, microcode, etc.), software (e.g., instructions run on a processing device), or a combination thereof. In one embodiment, method 800 is performed by the netlist optimizer 225 of FIG. 2.

At block 805, for each register having a modified initial value of the at least one reducible register 222 references any registers, then blocks 810 to 820 are executed. At block 810, the netlist optimizer 225 clones the modified initial value. At block 815, the netlist optimizer 225 inlines the initial-value of referenced registers in place of the register references to yield a gate clone. At block 820, the netlist optimizer 225 replaces the modified initial value by the gate clone. As used herein the term "clone" means "create a copy of (replicate) a portion of the netlist," e.g., to clone an AND gate (i1 & r2), a separate AND gate is created with the same inputs (i1 & r2).

Figure 9:
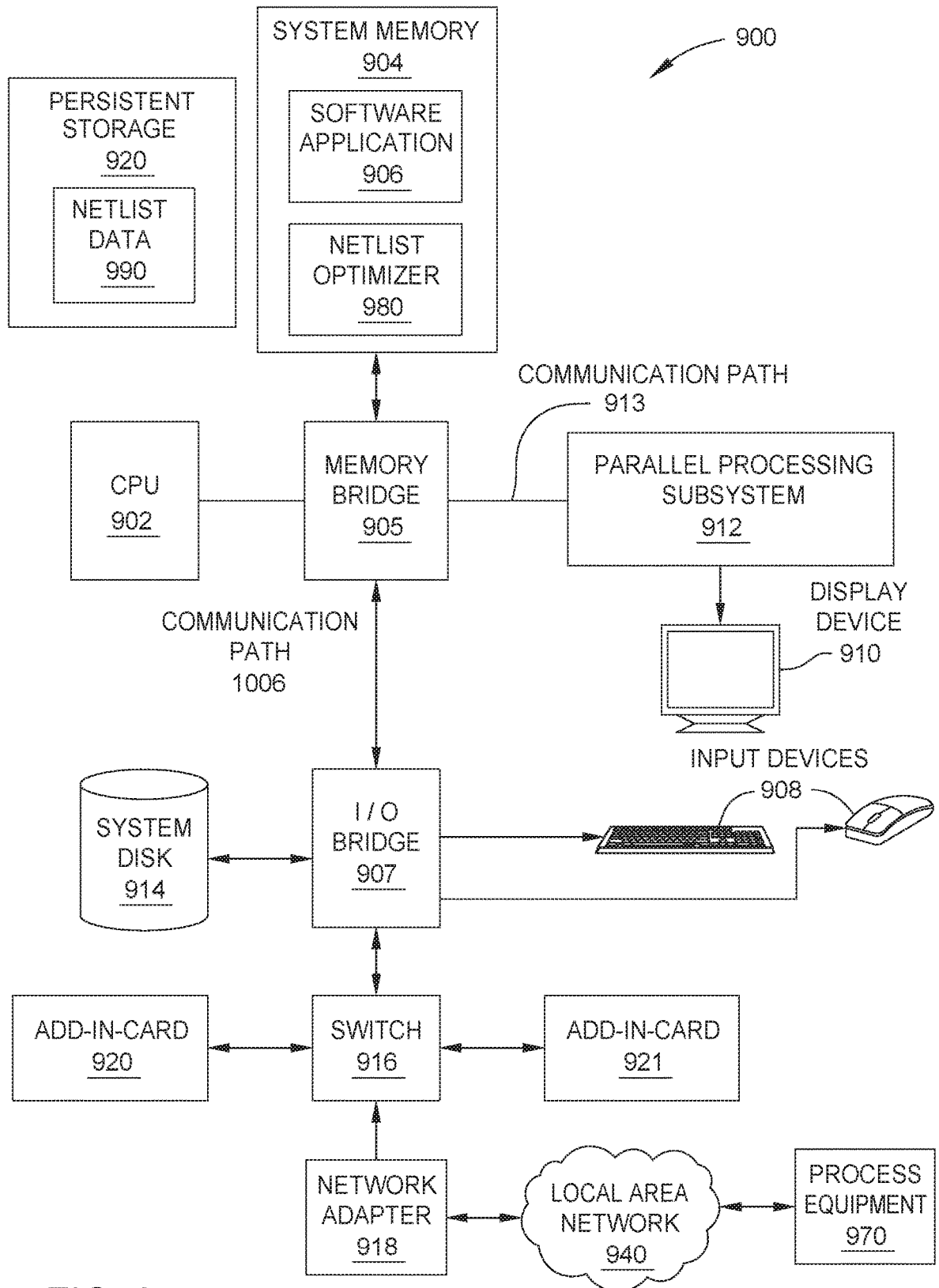
FIG. 9 illustrates an example computing system used to reduce the size of a netlist, according to one embodiment.

FIG. 9 illustrates an example computing system used to reduce the size of a netlist, according to embodiments of the present disclosure. In certain embodiments, computer system 900 is representative of the computer system 200. Aspects of computer system 900 may also be representative of other devices used to perform techniques described herein. For example, computing system 900 may be a personal computer, industrial processor, personal digital assistant, mobile phone, mobile device or any other device suitable for practicing one or more embodiments of the present invention.

The system 900 includes a central processing unit (CPU) 902 and a system memory 904 communicating via a bus path that may include a memory bridge 905. CPU 902 includes one or more processing cores, and, in operation, CPU 902 is the master processor of the system 900, controlling and coordinating operations of other system components. System memory 904 stores a software application 906, and data, for use by CPU 902. CPU 902 runs software applications and optionally an operating system.

Illustratively, the system memory 904 includes the netlist optimizer 980, which may correspond to the netlist optimizer 225, which performs operations related to reducing the size of a netlist, according to techniques described herein.

Memory bridge 905, which may be, e.g., a Northbridge chip, is connected via a bus or other communication path (e.g., a HyperTransport link) to an I/O (input/output) bridge 907. I/O bridge 907, which may be, e.g., a Southbridge chip, receives user input from one or more user input devices 908 (e.g., keyboard, mouse, joystick, digitizer tablets, touch pads, touch screens, still or video cameras, motion sensors, and/or microphones) and forwards the input to CPU 902 via memory bridge 905.

A display processor 912 is coupled to the memory bridge 985 via a bus or other communication path (e.g., a PCI Express, Accelerated Graphics Port, or HyperTransport link); in one embodiment display processor 912 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 904.

Display processor 912 periodically delivers pixels of the dashboard to a display device 910 (e.g., a screen or conventional CRT, plasma, OLED, SED or LCD based monitor or television). Additionally, display processor 912 may output pixels to film recorders adapted to reproduce computer 900 with an analog or digital signal.

Persistent storage 920 is also connected to I/O bridge 907 and may be configured to store content and applications and data, such as a database library 915, for use by CPU 902 and display processor 912. Persistent storage 920 provides non-volatile storage for applications and data and may include fixed or removable hard disk drives, flash memory devices, and CD-ROM, DVD-ROM, Blu-ray, HD-DVD, or other magnetic, optical, or solid state storage devices. Illustratively, persistent storage 920 includes netlist data 990, which may comprise information acquired by the netlist optimizer 225.

A switch 916 provides connections between the I/O bridge 907 and other components such as a network adapter 918 and various add-in cards 920 and 921. Network adapter 918 allows the system 900 to communicate with other systems via an electronic communications network, and may include wired or wireless communication over local area networks 940 and wide area networks such as the Internet.

Other components (not shown), including USB or other port connections, film recording devices, or other suitable computing device, may also be connected to I/O bridge 907. For example, process equipment 970 may operate from instructions and/or data provided by CPU 902, system memory 904, or persistent storage 920. Communication paths interconnecting the various components in FIG. 9 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, display processor 912 incorporates circuitry optimized for performing mathematical operations, including, for example, math co-processor, and may additionally constitute a graphics processing unit (GPU). In another embodiment, display processor 912 incorporates circuitry optimized for general purpose processing. In yet another embodiment, display processor 912 may be integrated with one or more other system elements, such as the memory bridge 905, CPU 902, and I/O bridge 907 to form a system on chip (SoC). In still further embodiments, display processor 912 is omitted and software executed by CPU 902 performs the functions of display processor 912.

Pixel data can be provided to display processor 912 directly from CPU 902. In some embodiments, instructions and/or data representing a netlist reduction analysis is provided to set of server computers, each similar to the system 900, via network adapter 918 or system disk 914. The servers may perform operations on subsets of the data using the provided instructions for analysis. The results from these operations may be stored on computer-readable media in a digital format and optionally returned to the system 900 for further analysis or display. Similarly, data may be output to other systems for display, stored in a database library 915 on the system disk 914, or stored on computer-readable media in a digital format.

Alternatively, CPU 902 provides display processor 912 with data and/or instructions defining the desired output images, from which display processor 912 generates the pixel data of one or more output images, including characterizing and/or adjusting the offset between stereo image pairs. The data and/or instructions defining the desired output images can be stored in system memory 904 or graphics memory within display processor 912. CPU 902 and/or display processor 912 can employ any mathematical, function or technique known in the art to create one or more results from the provided data and instructions, including running models and comparing data from sensors to track the service life of chamber components.

It will be appreciated that the system shown herein is illustrative and that variations and modifications are possible. The connection topology, including the number and arrangement of bridges, may be modified as desired. For instance, in some embodiments, system memory 904 is connected to CPU 902 directly rather than through a bridge, and other devices communicate with system memory 904 via memory bridge 905 and CPU 902. In other alternative topologies display processor 912 is connected to I/O bridge 907 or directly to CPU 902, rather than to memory bridge 905. In still other embodiments, I/O bridge 907 and memory bridge 905 might be integrated into a single chip. The particular components shown herein are optional; for instance, any number of add-in cards or peripheral devices might be supported. In some embodiments, the process equipment 970 may be connected directly to the I/O bridge 907. In some embodiments, the switch 916 is eliminated, and the network adapter 918 and the add-in cards 920, 921 connect directly to the I/O bridge 907.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., the netlist optimizer 225) or related data available in the cloud. For example, the netlist optimizer 225 could execute on a computing system in the cloud. Doing so allows a user to access this information from any computing system attached to a network connected to the cloud (e.g., the Internet).

While the foregoing is directed to embodiments of the present invention, other and further embodiments of the invention may be devised without departing from the basic scope thereof, and the scope thereof is determined by the claims that follow.

What is claimed is:

1. A method for reducing a size of a netlist, comprising:
   determining a first set of registers having constant next-state functions in the netlist;
   identifying an observable gate in fan-out of a register in the first set;
   identifying a second set of reducible registers in the fan-in of the observable gate, wherein an observable gate is a gate that is critical to a verification or synthesis context;
   modifying at least one of an initial value and a next-state function of at least one reducible register of the second set to reflect an observable value of the at least one reducible register observed at the observable gate; and
   simplifying one or more logic gates implementing the observable gate and the fan-in of the observable gate by eliminating a reference to a constant next-state function register in the first set of registers.

2. The method of claim 1, wherein the observable gate represents a single-output cut between the at least one reducible register and externally-observable gates.

3. The method of claim 2, wherein when the single-output cut comprises a multiplexor.

4. The method of claim 3, wherein said modifying and simplifying further comprises:
   identifying the multiplexor selected by one of the constant next-state function registers in the first set or its inverse, with either data input being the at least one reducible register or its inverse;
   modifying the initial value of the at least one reducible register to reflect the observable value of the at least one reducible register; and
   moving fan-out references of the multiplexor onto the at least one reducible register and eliminating the multiplexor from the netlist.

5. The method of claim 2, wherein when the single-output cut implements an observable AND gate of a form of at least one constant next-state function register in the first set or its inverse and the at least one reducible register or its inverse.

6. The method of claim 5, wherein said modifying and simplifying further comprises:
   modifying the initial value of the at least one reducible register to reflect the observable value of the observable gate at initialization time; and
   when a time after initialization time value of the observable gate is constant,
   modifying the next-state function of at least one reducible register of the second set to the constant; and
   moving fan-out references of the observable AND gate onto the at least one reducible register and eliminating the observable AND gate from the netlist.

7. The method of claim 2, wherein when the single-output cut implements an observable AND gate of a form of at least one constant next-state function register in the first set or its inverse, and the at least one reducible register or its inverse, and an arbitrary gate in the netlist.

8. The method of claim 7, wherein said modifying and simplifying further comprises:
   modifying the initial value of the at least one reducible register to reflect the observable value of the observable gate at initialization; and
   when a time after initialization time value of the observable gate is constant,
   modifying the next-state function of at least one reducible register of the second set to the constant; and
   moving fan-out references of the observable AND gate onto a simplified AND gate of a form of the at least one reducible register and the arbitrary gate and eliminating the observable AND gate from the netlist.

9. The method of claim 1, further comprising identifying a third set of observable gates in fan-out of the register in the first set.

10. The method of claim 9, wherein the third set of observable gates represents a multi-output cut between the at least one reducible register and externally-visible gates.

11. The method of claim 10, wherein said modifying and simplifying further comprises:
    identifying a Kth set of registers in the fan-in of the third set of observable gates;
    selecting from the Kth set a minimal Lth subset of reducible registers which covers a bipartite graph between Kth set of registers and the observable gates in the third set;
    for each reducible register in Lth subset:
    modifying an initial value of the at least one reducible register of the lth subset to reflect an observable value of a covered observable gate at initialization time;
    when a time after initialization time value of the covered observable gate is constant,
    modifying the next-state function of at least one reducible register of the Lth subset to the constant;

eliminating a reference to the constant next-state function register from the observable gates in the third set.

12. The method of claim 10, wherein the minimal Lth subset of reducible registers collectively fan-out to each of the third set of observable gates.

13. The method of claim 12, wherein for each reducible register in the Lth set:
modifying an initial value to reflect an observable value of a fan-out observable gate at initialization time;
when a time after initialization value of a fan-out observable gate is constant,
modifying a next-state function of the fan-out observable gate to the constant; and
eliminating a reference to the constant next-state function register from the observable gates of the third set and eliminating the fan-out observable gate from the netlist.

14. The method of claim 1, wherein, if any register having a modified initial value of the at least one reducible register references any registers,
cloning the modified initial value;
inlining the initial-value of referenced registers in place of the register references to yield a gate clone;
replacing the modified initial value by the gate clone.

15. A computer program product for reducing a size of a netlist, the computer program product comprising:
a computer-readable storage medium having computer-readable program code embodied therewith, the computer-readable program code executable by one or more computer processors to perform an operation comprising:
determining a first set of registers having constant next-state functions in the netlist;
identifying an observable gate in fan-out of a register in the first set, wherein an observable gate is a gate that is critical to a verification or synthesis context a gate that is critical to a verification or synthesis context;
identifying a second set of reducible registers in the fan-in of the observable gate;
modifying at least one of an initial value and a next-state function of at least one reducible register of the second set to reflect an observable value of the at least one reducible register observed at the observable gate; and
simplifying one or more logic gates implementing the observable gate and the fan-in of the observable gate by eliminating a reference to a constant next-state function register in the first set of registers.

16. The computer program product of claim 15, wherein the observable gate represents a single-output cut between the at least one reducible register and externally-observable gates.

17. The computer program product of claim 15, wherein said modifying and simplifying further comprises:
modifying the initial value of the at least one reducible register to reflect the observable value of the observable gate at initialization time; and
when a time after initialization time value of the observable gate is constant,
modifying the next-state function of at least one reducible register of the second set to the constant; and
moving fan-out references of the observable AND gate onto the at least one reducible register and eliminating the observable AND gate from the netlist.

18. A computing system for reducing a size of a netlist, comprising:
a computing processor; and
a memory comprising a program that when executed by the processor is configured to:
determine a first set of registers having constant next-state functions in the netlist;
identify an observable gate in fan-out of a register in the first set, wherein an observable gate is a gate that is critical to a verification or synthesis context;
identify a second set of reducible registers in the fan-in of the observable gate;
modify at least one of an initial value and a next-state function of at least one reducible register of the second set to reflect an observable value of the at least one reducible register observed at the observable gate; and
simplify one or more logic gates implementing the observable gate and the fan-in of the observable gate by eliminating a reference to a constant next-state function register in the first set of registers.

19. The computer program system of claim 18, wherein the observable gate represents a single-output cut between the at least one reducible register and externally observable gates.

20. The computer program system of claim 18, wherein said modifying and simplifying further comprises:
modifying the initial value of the at least one reducible register to reflect the observable value of the observable gate at initialization time; and
when a time after initialization time value of the observable gate is constant,
modifying the next-state function of at least one reducible register of the second set to the constant; and
moving fan-out references of the observable AND gate onto the at least one reducible register and eliminating the observable AND gate from the netlist.

* * * * *